US012451841B2

(12) United States Patent
Higuchi et al.

(10) Patent No.: US 12,451,841 B2
(45) Date of Patent: Oct. 21, 2025

(54) CIRCUIT DEVICE AND OSCILLATOR (71) Applicant: SEIKO EPSON CORPORATION, Tokyo (JP)

(72) Inventors: Teppei Higuchi, Chino (JP); Sho Matsuzaki, Ina (JP); Yuichi Toriumi, Minowa (JP); Toshiya Usuda, Ina (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 18/617,758

(22) Filed: Mar. 27, 2024

(65) Prior Publication Data

US 2024/0333216 A1 Oct. 3, 2024

(30) Foreign Application Priority Data

Mar. 28, 2023 (JP) .................. 2023-051089

(51) Int. Cl.
*H03B 5/36* (2006.01)
*H03B 5/04* (2006.01)
*H03B 5/32* (2006.01)

(52) U.S. Cl.
CPC ............... *H03B 5/364* (2013.01); *H03B 5/04* (2013.01); *H03B 5/326* (2013.01)

(58) Field of Classification Search
CPC ................................... H03B 5/364

USPC ................................. 331/116 FE
See application file for complete search history.

(56) References Cited

U.S. PATENT DOCUMENTS

| 2015/0116045 A1* | 4/2015 | Itasaka | H03B 5/04 29/25.35 |
| 2015/0116048 A1* | 4/2015 | Yamamoto | H03B 5/362 331/116 FE |
| 2020/0295707 A1* | 9/2020 | Itasaka | H03K 3/356017 |

FOREIGN PATENT DOCUMENTS

JP        2009-201097 A       9/2009

* cited by examiner

*Primary Examiner* — Joseph Chang
(74) *Attorney, Agent, or Firm* — Harness, Dickey & Pierce, P.L.C.

(57) ABSTRACT

A circuit device includes: a first terminal and a second terminal coupled to a resonator; a third terminal; a fourth terminal; a first switch provided on a signal path between the first terminal and the third terminal; a second switch provided on a signal path between the second terminal and the fourth terminal; and a register configured to output a signal for controlling the first switch and the second switch to be turned on or off. In a first mode, the first switch and the second switch are turned off, a control signal is input to the third terminal, and a clock signal is output from the fourth terminal. In a second mode, the first switch and the second switch are turned on.

7 Claims, 6 Drawing Sheets

CIRCUIT DEVICE AND OSCILLATOR

The present application is based on, and claims priority from JP Application Serial Number 2023-051089, filed Mar. 28, 2023, the disclosure of which is hereby incorporated by reference herein in its entirety.

BACKGROUND

1. Technical Field

The present disclosure relates to a circuit device and an oscillator.

2. Related Art

JP-A-2009-201097 describes a surface mounting oscillator in which a first switching circuit for coupling an output terminal to either an output circuit or one excitation electrode of a quartz crystal blank and a second switching circuit for coupling a functional terminal to either a functional circuit or the other excitation electrode of the quartz crystal blank are provided, and the first switching circuit and the second switching circuit operate according to a switching signal from a voltage detection circuit coupled to a power supply terminal. According to the surface mounting oscillator described in JP-A-2009-201097, it is possible to promote miniaturization by using a mounting terminal as a quartz crystal test terminal.

JP-A-2009-201097 is an example of the related art.

In the surface mounting oscillator described in JP-A-2009-201097, the first switching circuit and the second switching circuit operate due to unintended variation in a power supply voltage, and the functional terminal and the output terminal are respectively coupled to the two excitation electrodes of the quartz crystal blank during a normal operation of the oscillator, which may cause an operation failure.

SUMMARY

A circuit device according to an aspect of the present disclosure includes:
  a first terminal and a second terminal coupled to a resonator;
  a third terminal;
  a fourth terminal;
  a first switch provided on a signal path between the first terminal and the third terminal;
  a second switch provided on a signal path between the second terminal and the fourth terminal; and
  a register configured to output a signal for controlling the first switch and the second switch to be turned on or off,
  in which
  in a first mode, the first switch and the second switch are turned off, a control signal is input to the third terminal, and a clock signal is output from the fourth terminal, and
  in a second mode, the first switch and the second switch are turned on.

An oscillator according to an aspect of the present disclosure includes:
  a resonator;
  a circuit device coupled to the resonator; and
  a container accommodating the resonator and the circuit device, in which
  the circuit device includes:
    a first terminal and a second terminal coupled to the resonator;
    a third terminal;
    a fourth terminal;
    a first switch provided on a signal path between the first terminal and the third terminal;
    a second switch provided on a signal path between the second terminal and the fourth terminal; and
    a register configured to output a signal for controlling the first switch and the second switch to be turned on or off,
  the container includes:
    a first external terminal coupled to the third terminal; and
    a second external terminal coupled to the fourth terminal,
  in a first mode, the first switch and the second switch are turned off, a control signal is input to the first external terminal, and a clock signal is output from the second external terminal, and
  in a second mode, the first switch and the second switch are turned on.

DESCRIPTION OF EMBODIMENTS

Hereinafter, preferred embodiments of the present disclosure will be described in detail with reference to the drawings. The embodiments to be described below do not unduly limit contents of the present disclosure described in the claims. In addition, not all configurations to be described below are necessarily essential components of the present disclosure.

1. Configuration of Oscillator

Figure 1:
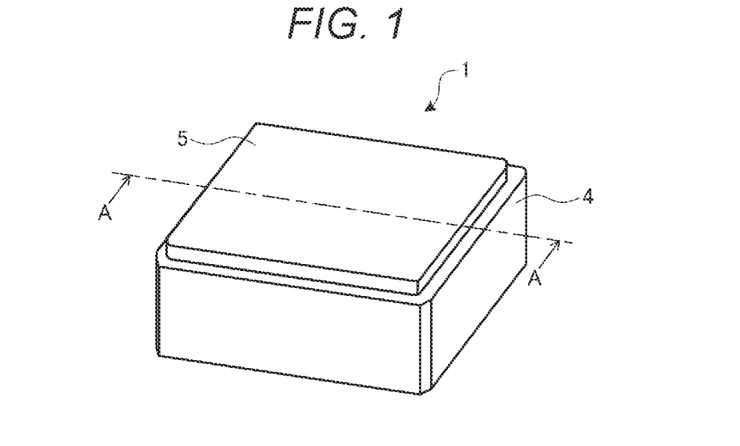
FIG. 1 is a perspective view of an oscillator according to an embodiment.
Figure 2:
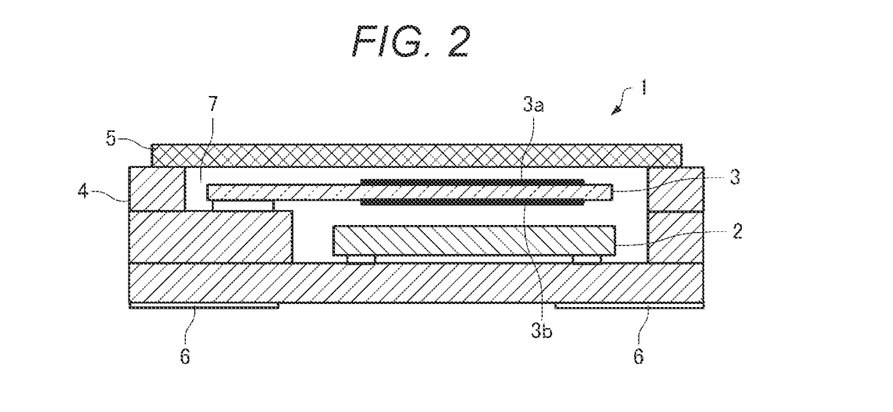
FIG. 2 is a cross-sectional view of the oscillator according to the embodiment.
Figure 3:
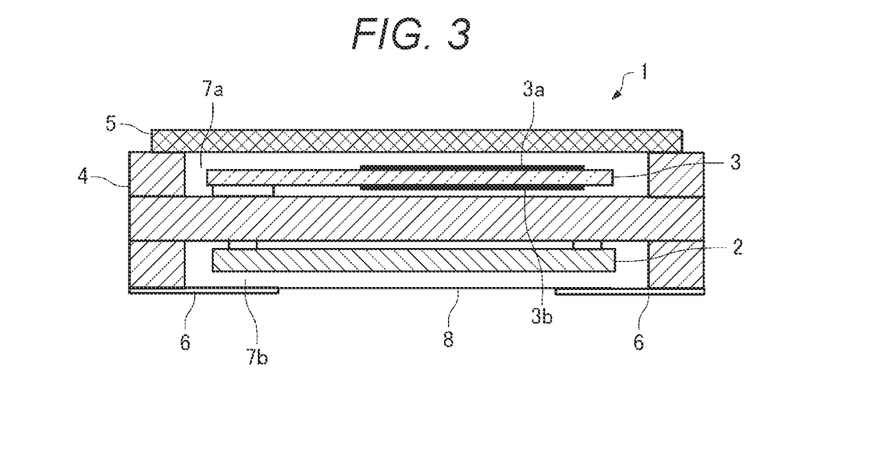
FIG. 3 is another cross-sectional view of the oscillator according to the embodiment.
Figure 4:
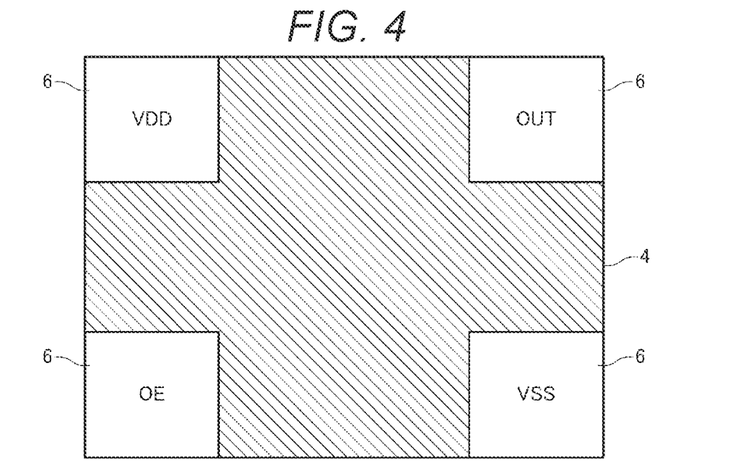
FIG. 4 is a bottom view of the oscillator according to the embodiment.

FIGS. 1 to 4 are diagrams showing an example of a structure of an oscillator 1 of the embodiment. FIG. 1 is a perspective view of the oscillator 1. FIG. 2 is an example of a cross-sectional view taken along line A-A in FIG. 1. FIG. 3 is another example of the cross-sectional view taken along the line A-A in FIG. 1. FIG. 4 is a bottom view of the oscillator 1.

As shown in FIGS. 1 to 3, the oscillator 1 includes a circuit device 2, a resonator 3, a package 4, a lid 5, and a plurality of external terminals 6. In the embodiment, the resonator 3 is a quartz crystal resonator using a quartz crystal as a substrate material, and is, for example, an AT cut quartz crystal resonator or a tuning fork type quartz crystal resonator. The resonator 3 may be a SAW resonator. SAW is an abbreviation for surface acoustic wave. As the substrate material for the resonator 3, in addition to the quartz crystal, a piezoelectric material such as a piezoelectric single crystal formed of lithium tantalate, lithium niobate, or the like, a piezoelectric ceramic formed of lead zirconate titanate or the like can be used. As an excitation unit of the resonator 3, a unit based on a piezoelectric effect may be used. In the embodiment, the circuit device 2 is implemented by a one-chip integrated circuit. However, at least a part of the circuit device 2 may be implemented by discrete components.

The oscillator 1 shown in FIG. 2 is an oscillator having a single seal structure, and the package 4 is a container that accommodates the circuit device 2 and the resonator 3 in the same space. Specifically, the package 4 is formed with a recess, and the recess is covered with the lid 5 to form a housing chamber 7. The oscillator 1 shown in FIG. 3 is an oscillator having an H-shaped structure, and the package 4 is a container that accommodates the circuit device 2 and the resonator 3 in different spaces. Specifically, the package 4 is formed with two recesses on facing surfaces thereof, the lid 5 covers one recess to form a housing chamber 7a, and a sealing member 8 covers the other recess to form a housing chamber 7b. The resonator 3 is housed in the housing chamber 7a, and the circuit device 2 is housed in the housing chamber 7b.

The resonator 3 includes metal excitation electrodes 3a and 3b on a front surface and a back surface of the resonator 3, and oscillates at a desired frequency according to a shape and mass of the resonator 3 including the excitation electrodes 3a and 3b. Interconnects (not shown) for electrically coupling two terminals of the circuit device 2, specifically, a T1 terminal and a T2 terminal of FIG. 5 to the two excitation electrodes 3a and 3b of the resonator 3 are provided inside the package 4 or at a surface of the recess. Interconnects (not shown) for electrically coupling the terminals of the circuit device 2 to the external terminals 6 provided on a bottom surface of the package 4 are provided inside the package 4 or at the surface of the recess.

As shown in FIG. 4, in the oscillator 1 of the embodiment, four external terminals 6 including a VDD terminal which is a power supply terminal to which a power supply voltage Vdd is supplied, a VSS terminal which is a ground terminal to which a ground voltage Vss is supplied, an OUT terminal which is an output terminal, and an OE terminal which is an output enable terminal are provided on a back surface of the package 4 which is a bottom surface. That is, in the embodiment, the package 4 includes the four external terminals 6, that is, the VDD terminal, the VSS terminal, the OUT terminal, and the OE terminal.

Figure 5:
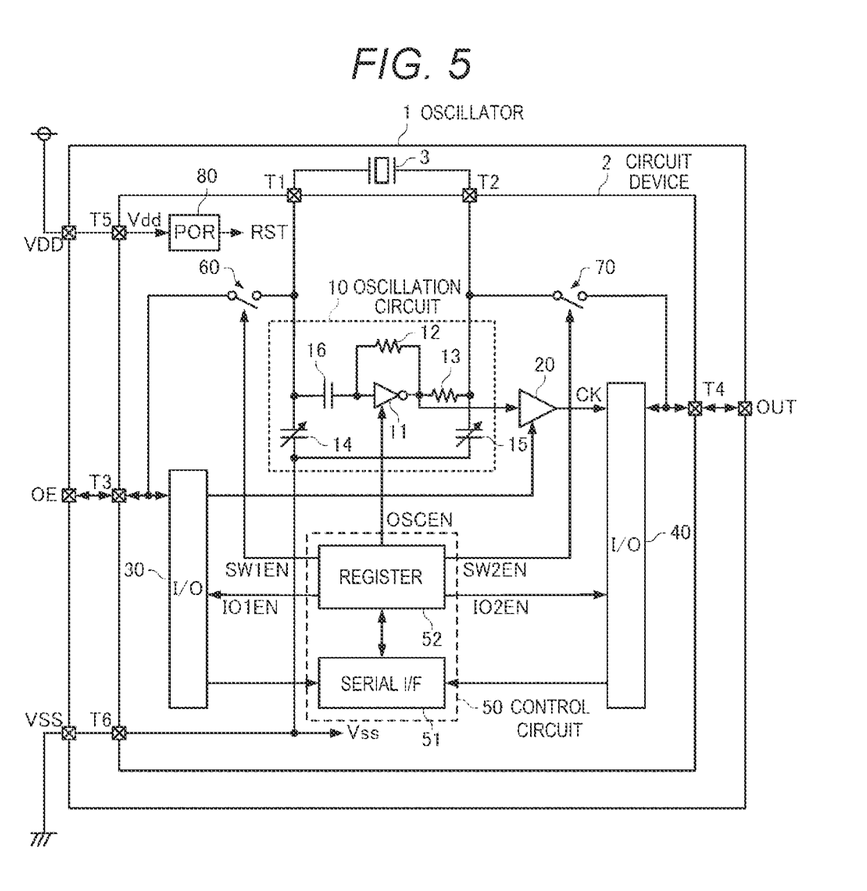
FIG. 5 is a functional block diagram of the oscillator according to the embodiment.

FIG. 5 is a functional block diagram of the oscillator 1 according to a first embodiment. As shown in FIG. 5, the oscillator 1 according to the embodiment includes the circuit device 2 and the resonator 3. The circuit device 2 includes the T1 terminal, the T2 terminal, a T3 terminal, a T4 terminal, a T5 terminal, and a T6 terminal as external coupling terminals. The T1 terminal is electrically coupled to one end of the resonator 3, and the T2 terminal is electrically coupled to the other end of the resonator 3. The T3 terminal, the T4 terminal, the T5 terminal, and the T6 terminal are electrically coupled to the OE terminal, the OUT terminal, the VDD terminal, and the VSS terminal, respectively, which are the plurality of external terminals 6 of the oscillator 1 shown in FIG. 4.

In the embodiment, the circuit device 2 includes an oscillation circuit 10, an output buffer 20, a first input and output circuit 30, a second input and output circuit 40, a control circuit 50, a first switch 60, a second switch 70, and a power-on reset circuit 80. The circuit device 2 may have a configuration obtained by omitting or changing some of the elements, or adding other elements.

The oscillation circuit 10 is coupled to the T1 terminal and the T2 terminal, and oscillates the resonator 3 to generate an oscillation signal. The oscillation circuit 10 includes an amplifier circuit that amplifies a signal from the T1 terminal and outputs the amplified signal to the T2 terminal. Specifically, the oscillation circuit 10 receives a signal output from the resonator 3 via the T1 terminal, amplifies the signal by the amplifier circuit, and supplies the amplified signal to the resonator 3 via the T2 terminal. For example, as shown in FIG. 5, the oscillation circuit 10 includes a logic inversion circuit 11, resistors 12 and 13, variable capacitance circuits 14 and 15, and a capacitance element 16.

One end of the variable capacitance circuit 14 is coupled to the T1 terminal, and the ground voltage Vss is supplied to the other end. One end of the variable capacitance circuit 15 is coupled to the T2 terminal, and the ground voltage Vss is supplied to the other end. One end of the capacitance element 16 is coupled to the T1 terminal, and the other end is coupled to one end of the resistor 12 and an input terminal of the logic inversion circuit 11.

The input terminal of the logic inversion circuit 11 is coupled to the other end of the capacitance element 16 and the one end of the resistor 12, and an output terminal of the logic inversion circuit 11 is coupled to the other end of the resistor 12 and one end of the resistor 13. The other end of the resistor 13 is coupled to the one end of the variable capacitance circuit 15 and the T2 terminal. An oscillation enable signal OSCEN is input to a control terminal of the logic inversion circuit 11.

In the oscillation circuit 10 configured as described above, when the oscillation enable signal OSCEN is at a high level, the signal received from the resonator 3 via the T1 terminal is input to the logic inversion circuit 11 with a DC component cut by the capacitance element 16, and a signal inverted and amplified by the logic inversion circuit 11 which is an amplifier circuit is supplied to the resonator 3 via the resistor 13 and the T2 terminal. Accordingly, the resonator 3 oscillates. On the other hand, when the oscillation enable signal OSCEN is at a low level, the logic inversion circuit 11 brings an output signal into a high impedance state regardless of a logic level of an input signal, thereby stopping an oscillation operation of the resonator 3.

The variable capacitance circuits 14 and 15 function as load capacitances of the resonator 3. An oscillation frequency of the resonator 3 decreases as capacitance values of the variable capacitance circuits 14 and 15 increase, and the oscillation frequency of the resonator 3 increases as the capacitance values of the variable capacitance circuits 14 and 15 decrease. The variable capacitance circuits 14 and 15 are provided for adjusting the oscillation frequency such that the resonator 3 oscillates at a desired frequency. Information for setting the capacitance values of the variable capacitance circuits 14 and 15 is stored in a nonvolatile memory (not shown).

The output buffer 20 receives the oscillation signal from the oscillation circuit 10 and outputs a clock signal CK.

Specifically, the oscillation signal output from the logic inversion circuit 11 of the oscillation circuit 10 is input to the input terminal of the output buffer 20. Then, the output buffer 20 buffers the oscillation signal, and outputs the clock signal CK from an output terminal when a signal input to a control terminal is at the high level. The output buffer 20 outputs the ground voltage Vss from the output terminal when the signal input to the control terminal is at the low level.

The control circuit 50 controls an operation of each circuit. Specifically, the control circuit 50 sets an operation mode of the circuit device 2 to one of a plurality of modes including a normal operation mode, an external communication mode, and a test mode, and performs control according to the set operation mode. The normal operation mode is an operation mode in which the oscillation circuit 10 performs an oscillation operation and whether the clock signal CK is output from the OUT terminal is controlled according to the control signal received from the OE terminal. The external communication mode is an operation mode in which the control circuit 50 communicates with an external device (not shown) via the OE terminal and the OUT terminal. The test mode is an operation mode in which the first input and output circuit 30 and the second input and output circuit 40 are both turned off, the first switch 60 and the second switch 70 are both turned on, and the both ends of the resonator 3 are coupled to the external device via the OE terminal and the OUT terminal, respectively. In the embodiment, as shown in FIG. 5, the control circuit 50 includes a serial interface circuit 51 and a register 52.

When a control signal having a predetermined pattern is received from the OE terminal within a predetermined period after the supply of the power supply voltage Vdd to the VDD terminal is started, the serial interface circuit 51 sets the operation mode to the external communication mode after the predetermined period elapses. When the control signal having the predetermined pattern is not received from the OE terminal within the predetermined period after the supply of the power supply voltage Vdd is started, the serial interface circuit 51 sets the operation mode to the normal operation mode without setting the operation mode to the external communication mode after the predetermined period elapses. For example, the serial interface circuit 51 may set, as the predetermined period, a period from the start of the oscillation of the resonator 3 due to the supply of the power supply voltage Vdd to detection of stable oscillation, or may count the number of pulses of the clock signal CK and determine that the predetermined period elapses when a count value reaches a predetermined value. For example, the serial interface circuit 51 may measure the predetermined period based on an output signal of an RC time constant circuit, which starts an operation upon the supply of the power supply voltage Vdd.

In the external communication mode, the serial interface circuit 51 is electrically coupled to the OE terminal via the first input and output circuit 30, is electrically coupled to the OUT terminal via the second input and output circuit 40, and can perform data communication with the external device (not shown) via the OE terminal and the OUT terminal. In the embodiment, in the external communication mode, the OE terminal and the T3 terminal are serial data terminals, and the OUT terminal and the T4 terminal are serial clock terminals. Then, the external device outputs a serial clock signal to the OUT terminal, outputs a serial data signal to the OE terminal in synchronization with the serial clock signal, or acquires a signal output from the serial interface circuit 51 to the OE terminal, according to a predetermined communication standard. In the external communication mode, the serial interface circuit 51 samples serial data signals as various commands for each edge of the serial clock signal according to, for example, a standard of an I2C bus. I2C is an abbreviation for inter-integrated circuit. Then, the serial interface circuit 51 performs processing such as setting of an operation mode and reading and writing of data from and to the register 52 based on the sampled commands. In the embodiment, the serial interface circuit 51 communicates with an external device according to a communication standard of a two-wire bus such as the I2C bus, and may communicate with an external device according to a communication standard of a three-wire bus such as an SPI bus or a four-wire bus. SPI is an abbreviation for serial peripheral interface.

For example, when the serial interface circuit 51 samples a register setting command, specified data is written into an address of the register 52 specified by the register setting command. The register 52 stores data of a plurality of bits, and outputs 5 bits among the plurality of bits as the oscillation enable signal OSCEN, a first switch enable signal SW1EN, a second switch enable signal SW2EN, a first input and output enable signal IO1EN, and a second input and output enable signal IO2EN. The oscillation enable signal OSCEN is a signal for controlling an operation of the oscillation circuit 10. The first switch enable signal SW1EN and the second switch enable signal SW2EN are signals that control the first switch 60 and the second switch 70 to be turned on or off, respectively. The first input and output enable signal IO1EN and the second input and output enable signal IO2EN are signals that control the first input and output circuit 30 and the second input and output circuit 40 to be turned on or off, respectively.

In the external communication mode, the external device can set the oscillation enable signal OSCEN, the first switch enable signal SW1EN, and the second switch enable signal SW2EN to a low level or a high level by transmitting the register setting command to the serial interface circuit 51 via the OE terminal and the OUT terminal. The external device sets the oscillation enable signal OSCEN to the low level and sets both the first switch enable signal SW1EN and the second switch enable signal SW2EN to the high level according to the register setting command, and then completes the communication. Accordingly, the serial interface circuit 51 sets both the first input and output enable signal IO1EN and the second input and output enable signal IO2EN to the low level, and the operation mode transitions from the external communication mode to the test mode.

The first input and output circuit 30 is provided on a signal path between the T3 terminal and the register 52. The first input and output circuit 30 is provided on a signal path between the T3 terminal and the output buffer 20. Then, the first input and output circuit 30 is turned on or off according to a logic level of the first input and output enable signal IO1EN. Specifically, when the first input and output enable signal IO1EN is at the high level, the first input and output circuit 30 is turned on. Then, when the first input and output circuit 30 is turned on, in the normal operation mode, the T3 terminal and the control terminal of the output buffer 20 are electrically coupled to each other, and the T3 terminal and the register 52 are electrically cut off from each other. When the first input and output circuit 30 is turned on, in the external communication mode, the T3 terminal and the register 52 are electrically coupled to each other via the serial interface circuit 51, and the T3 terminal and the control terminal of the output buffer 20 are electrically cut off from each other. On the other hand, in the test mode, when the first input and output enable signal IO1EN is at the low level and the first input and output enable signal IO1EN is at the low level, the first input and output circuit 30 is turned off. When the first input and output circuit 30 is turned off, the T3 terminal and the control terminal of the output buffer 20 are electrically cut off from each other, and the T3 terminal and the register 52 are electrically cut off from each other. As described above, the first input and output circuit 30 is controlled by the first input and output enable signal IO1EN output from the register 52, is turned on in the normal operation mode and the external communication mode, and is turned off in the test mode.

The second input and output circuit 40 is provided on a signal path between the output buffer 20 and the T4 terminal. The second input and output circuit 40 is provided on a signal path between the T4 terminal and the register 52. Then, the second input and output circuit 40 is turned on or off according to a logic level of the second input and output enable signal IO2EN. Specifically, when the second input and output enable signal IO2EN is at the high level, the second input and output circuit 40 is turned on. Then, when the second input and output circuit 40 is turned on, in the normal operation mode, the output terminal of the output buffer 20 and the T4 terminal are electrically coupled to each other, and the T4 terminal and the register 52 are electrically cut off from each other. When the second input and output circuit 40 is turned on, in the external communication mode, the T4 terminal and the register 52 are electrically coupled to each other via the serial interface circuit 51, and the output terminal of the output buffer 20 and the T4 terminal are electrically cut off from each other. On the other hand, in the test mode, when the second input and output enable signal IO2EN is at the low level and the second input and output enable signal IO2EN is at the low level, the second input and output circuit 40 is turned off. When the second input and output circuit 40 is turned off, the output buffer 20 and the T4 terminal are electrically cut off from each other, and the T4 terminal and the register 52 are electrically cut off from each other. As described above, the second input and output circuit 40 is controlled by the second input and output enable signal IO2EN output from the register 52, is turned on in the normal operation mode and the external communication mode, and is turned off in the test mode.

The first switch 60 is provided on a signal path between the T1 terminal and the T3 terminal. Then, the first switch 60 is turned on or off according to a logic level of the first switch enable signal SW1EN. Specifically, in the normal operation mode and the external communication mode, when the first switch enable signal SW1EN is at the low level and the first switch enable signal SW1EN is at the low level, the first switch 60 is turned off. When the first switch 60 is turned off, the T1 terminal and the T3 terminal are electrically cut off from each other. Accordingly, the one end of the resonator 3 and the OE terminal are electrically cut off from each other. On the other hand, in the test mode, when the first switch enable signal SW1EN is at the high level and the first switch enable signal SW1EN is at the high level, the first switch 60 is turned on. When the first switch 60 is turned on, the T1 terminal and the T3 terminal are electrically coupled to each other. Accordingly, the one end of the resonator 3 and the OE terminal are electrically coupled to each other.

The second switch 70 is provided on a signal path between the T2 terminal and the T4 terminal. Then, the second switch 70 is turned on or off according to a logic level of the second switch enable signal SW2EN. Specifically, in the normal operation mode and the external communication mode, when the second switch enable signal SW2EN is at the low level and the second switch enable signal SW2EN is at the low level, the second switch 70 is turned off. When the second switch 70 is turned off, the T2 terminal and the T4 terminal are electrically cut off from each other. Accordingly, the other end of the resonator 3 and the OUT terminal are electrically cut off from each other. On the other hand, in the test mode, when the second switch enable signal SW2EN is at the high level and the second switch enable signal SW2EN is at the high level, the second switch 70 is turned on. When the second switch 70 is turned on, the T2 terminal and the T4 terminal are electrically coupled to each other. Accordingly, the other end of the resonator 3 and the OUT terminal are electrically coupled to each other.

When the supply of the power supply voltage Vdd to the VDD terminal is started, the power-on reset circuit 80 outputs a reset signal RST that is at a high level for a predetermined period. The register 52 is reset by the reset signal RST, the oscillation enable signal OSCEN, the first input and output enable signal IO1EN, and the second input and output enable signal IO2EN are initialized to the high level, and the first switch enable signal SW1EN and the second switch enable signal SW2EN are initialized to the low level. Thereafter, when the predetermined period elapses, the operation mode of the circuit device 2 is initialized to the normal operation mode. That is, the circuit device 2 is set to the normal operation mode based on an initial value of the register 52 set at the time of power-on.

As described above, in the external communication mode, a setting value for controlling the first switch 60 and the second switch 70 is set into the register 52 by communication using the T3 terminal and the T4 terminal. In the normal operation mode, the first switch 60 and the second switch 70 are turned off, the one end of the resonator 3 and the T3 terminal are electrically cut off from each other, and the other end of the resonator 3 and the T4 terminal are electrically cut off from each other. Then, a control signal for controlling an operation of the output buffer 20 is input to the T3 terminal, and the clock signal CK is output from the T4 terminal. Accordingly, in the normal operation mode, the oscillator 1 outputs the clock signal CK from the OUT terminal according to the control signal received from the OE terminal.

On the other hand, in the test mode, the first switch 60 and the second switch 70 are turned on, the T1 terminal and the T3 terminal are electrically coupled to each other, and the T2 terminal and the T4 terminal are electrically coupled to each other. Accordingly, the one end of the resonator 3 and the OE terminal are electrically coupled to each other, and the other end of the resonator 3 and the OUT terminal are electrically coupled to each other. Therefore, the test device, which is an external device, can test a CI value of the resonator 3 using the OE terminal and the OUT terminal. Since a DC path from the T1 terminal to the T2 terminal via the resistor 12 and the resistor 13 is cut off by the capacitance element 16, the test is not adversely influenced by the path.

In the embodiment, the T1 terminal is an example of a first terminal, the T2 terminal is an example of a second terminal, the T3 terminal is an example of a third terminal, and the T4 terminal is an example of a fourth terminal. The OE terminal is an example of a first external terminal, and the OUT terminal is an example of a second external terminal. The normal operation mode is an example of a first mode, the test mode is an example of a second mode, and the external communication mode is an example of a third mode.

2. Method of Testing CI Value

As described above, in the embodiment, in the test mode, the one end of the resonator 3 and the OE terminal are electrically coupled to each other, and the other end of the resonator 3 and the OUT terminal are electrically coupled to each other. Therefore, the test device, which is the external device, can test the CI value of the resonator 3 using the OE terminal and the OUT terminal.

Figure 6:
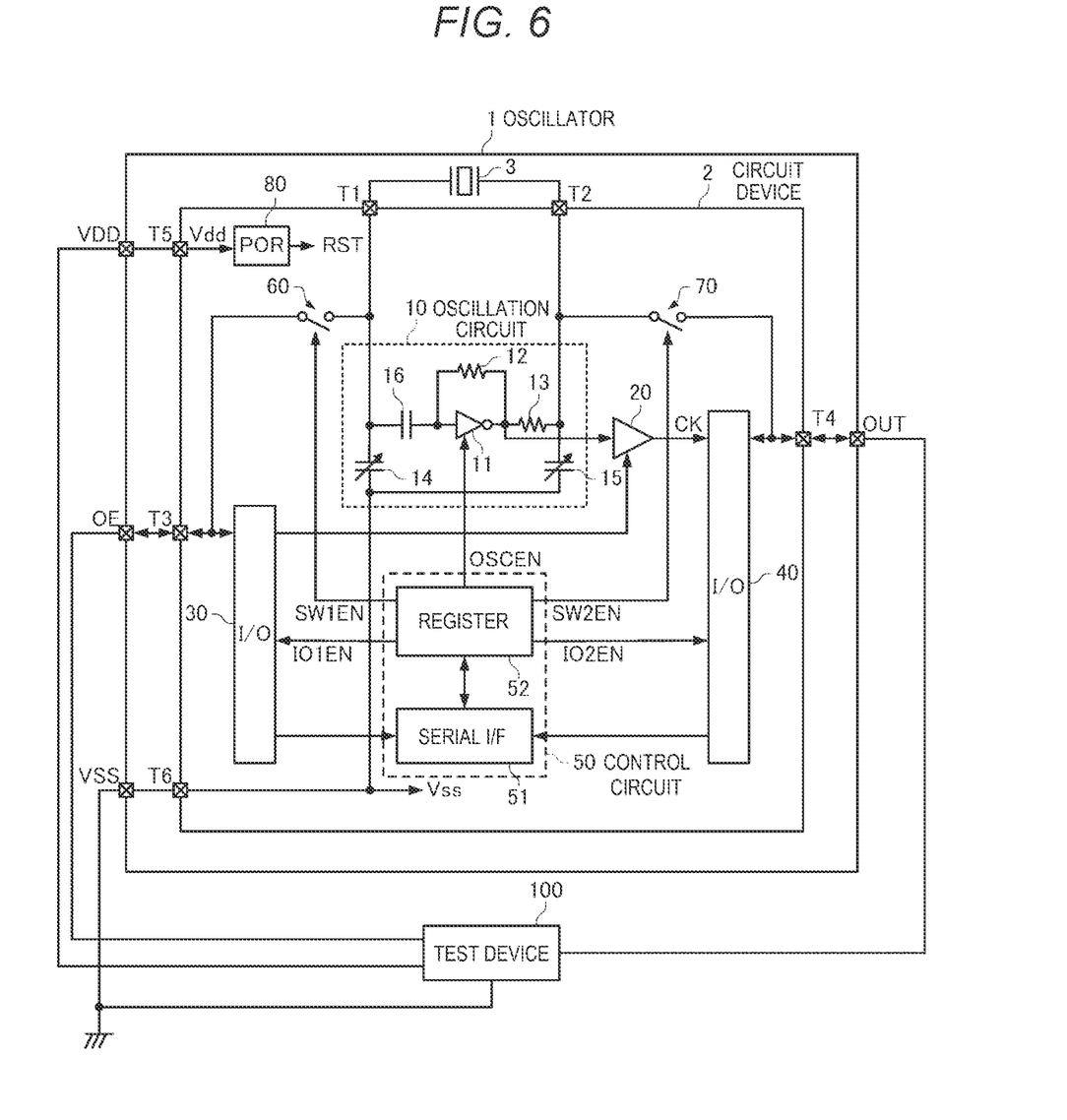
FIG. 6 is a diagram showing a configuration of a test system in which a test device is coupled to the oscillator according to the embodiment.

FIG. 6 is a diagram showing a configuration of a test system in which a test device 100 is coupled to the oscillator 1. As shown in FIG. 6, the test device 100 is coupled to the VDD terminal, the VSS terminal, the OE terminal, and the OUT terminal of the oscillator 1. The ground of the oscillator 1 and the ground of the test device 100 are common.

Figure 7:
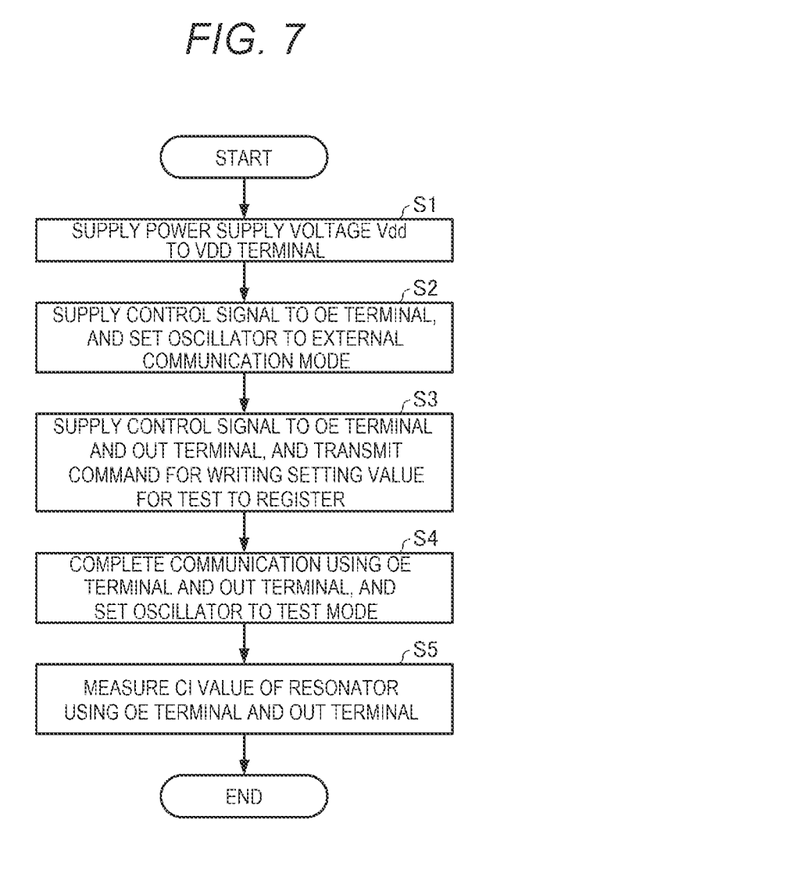
FIG. 7 is a flowchart showing an example of a procedure of a method of testing a CI value of a resonator by the test device.
Figure 8:
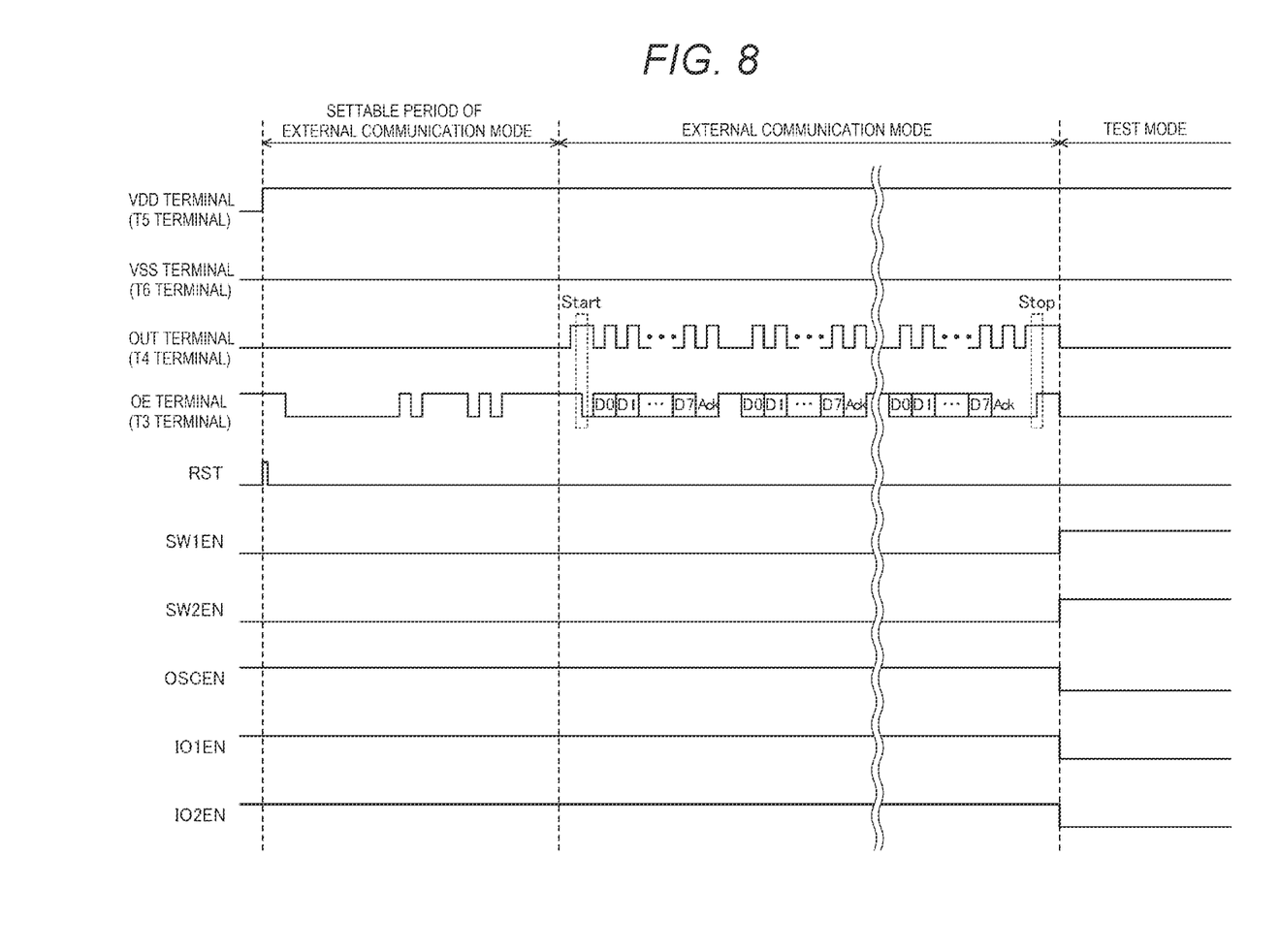
FIG. 8 is a diagram showing an example of voltage waveforms of each terminal and each signal when the test device tests the CI value.

FIG. 7 is a flowchart showing an example of a procedure of a method of testing the CI value of the resonator 3 by the test device 100 in the test system of FIG. 6. FIG. 8 is a diagram showing an example of voltage waveforms of each terminal and each signal when the CI value is tested according to the flowchart of FIG. 7.

In the example of FIG. 7, first, in step S1, the test device 100 supplies the power supply voltage Vdd to the VDD terminal of the oscillator 1. In step S1, as shown in FIG. 8, the VDD terminal rises from the ground voltage Vss to a desired voltage. Accordingly, the reset signal RST which is at the high level for a predetermined period is generated, and each bit of the register 52 is initialized. As a result, the first switch enable signal SW1EN and the second switch enable signal SW2EN are initialized to the low level, and the first switch 60 and the second switch 70 are turned off. The oscillation enable signal OSCEN is initialized to the high level, and the oscillation circuit 10 starts the oscillation operation. The first input and output enable signal IO1EN and the second input and output enable signal IO2EN are initialized to the high level, and the first input and output circuit 30 and the second input and output circuit 40 are turned on.

Next, in step S2, the test device 100 supplies a control signal to the OE terminal of the oscillator 1, and sets the oscillator 1 to the external communication mode. That is, as shown in FIG. 8, the test device 100 supplies a predetermined signal having a predetermined pattern to the OE terminal of the oscillator 1 within a predetermined period after supplying the power supply voltage Vdd to the VDD terminal, and sets the oscillator 1 to the external communication mode.

Next, in step S3, the test device 100 supplies a control signal to the OUT terminal and the OE terminal of the oscillator 1, and transmits a command for writing a setting value for test to the register 52. That is, as shown in FIG. 8, the test device 100 fixes the logic level of the OUT terminal to the high level and changes the logic level of the OE terminal from the high level to the low level, thereby establishing a start condition and starting communication. Then, the test device 100 inputs a serial data signal from the OE terminal, inputs a serial clock signal from the OUT terminal, and transmits a command for writing a desired value to each bit of the register 52.

Next, in step S4, the test device 100 completes the communication using the OE terminal and the OUT terminal, and sets the oscillator 1 to the test mode. That is, as shown in FIG. 8, the test device 100 fixes the logic level of the OUT terminal to the high level and changes the logic level of the OE terminal from the low level to the high level, thereby establishing a stop condition and completing the communication. Accordingly, the serial interface circuit 51 writes a desired setting value to the register 52. As shown in FIG. 8, the first switch enable signal SW1EN and the second switch enable signal SW2EN change from the low level to the high level, and the first switch 60 and the second switch 70 are turned on. The oscillation enable signal OSCEN changes from the high level to the low level, and the oscillation circuit 10 stops the oscillation operation. Further, the first input and output enable signal IO1EN and the second input and output enable signal IO2EN change from the high level to the low level, and the oscillator 1 is set to the test mode.

Figure 9:
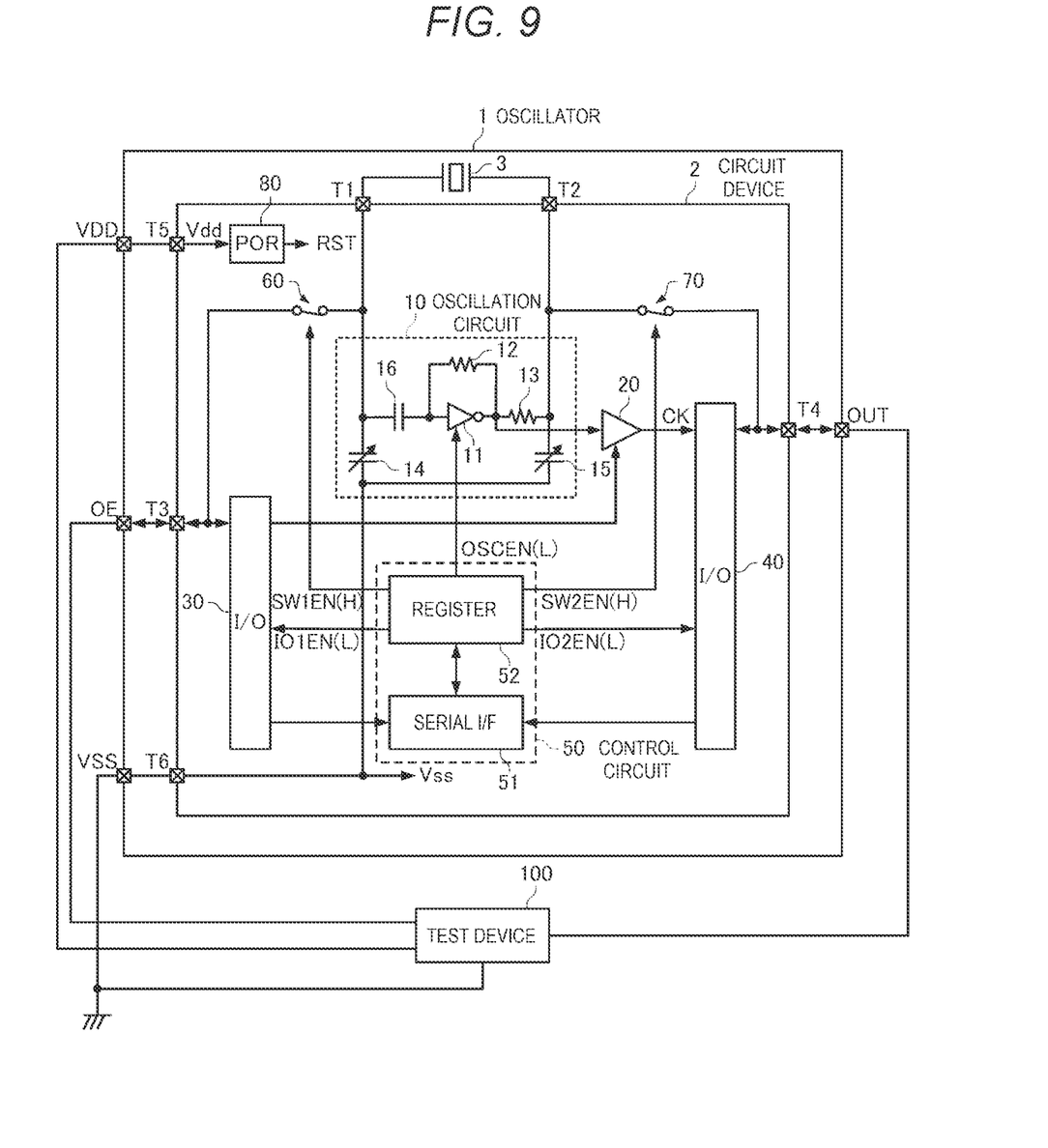
FIG. 9 is a diagram showing a state of the oscillator in a test mode.

FIG. 9 shows a state of the oscillator 1 in the test mode. In the test mode, the first switch enable signal SW1EN and the second switch enable signal SW2EN are at the high level, and the first switch 60 and the second switch 70 are turned on. As a result, the OE terminal and the one end of the resonator 3 are electrically coupled to each other, and the OUT terminal and the other end of the resonator 3 are electrically coupled to each other. The oscillation enable signal OSCEN is at the low level, and the oscillation circuit 10 stops the oscillation operation. The first input and output enable signal IO1EN and the second input and output enable signal IO2EN are at the low level, and the first input and output circuit 30 and the second input and output circuit 40 are turned off.

Finally, in step S5, the test device 100 measures the CI value of the resonator 3 using the OE terminal and the OUT terminal. For example, the test device 100 includes an impedance analyzer, and measures an impedance of the resonator 3 using one of the OE terminal and the OUT terminal while sweeping a frequency of a signal input to the other one of the OE terminal and the OUT terminal.

As shown in FIG. 9, in the test mode, since the first input and output circuit 30 and the second input and output circuit 40 are turned off, the coupling between the OE terminal and the first input and output circuit 30 and the coupling between the OUT terminal and the second input and output circuit 40 become a high impedance, a signal of the OE terminal is not influenced by the first input and output circuit 30, and a signal of the OUT terminal is not influenced by the second input and output circuit 40. Further, in the test mode, the oscillation circuit 10 stops the oscillation operation and the coupling between the oscillation circuit 10 and the resonator 3 also becomes a high impedance, so that the resonator 3 is not influenced by the oscillation circuit 10. Accordingly, the test device 100 can test the CI value of the resonator 3 with high accuracy.

3. Operation and Effect

As described above, in the oscillator 1 according to the embodiment, in the circuit device 2, in the normal operation mode, the first switch 60 and the second switch 70 are turned off, the T3 terminal and the T4 terminal are electrically cut off from the T1 terminal and the T2 terminal, and the clock signal CK based on the oscillation operation of the resonator 3 is output from the T4 terminal according to the control signal input to the T3 terminal. On the other hand, in the circuit device 2, in the test mode, the first switch 60 and the second switch 70 are turned on, and the T3 terminal and the T4 terminal are electrically coupled to the both ends of the resonator 3 via the T1 terminal and the T2 terminal, respectively. Accordingly, according to the oscillator 1 of the embodiment, in the test mode, the test device 100 can test the resonator 3 using the OE terminal and the OUT terminal coupled to the T3 terminal and the T4 terminal, respectively.

In the oscillator 1 according to the embodiment, in the circuit device 2, the first switch 60 and the second switch 70 are controlled to be turned on or off according to a signal output from the register 52. Therefore, in the circuit device 2, the first switch 60 and the second switch 70 are not turned on in the normal operation mode as long as the power supply voltage Vdd does not greatly variate as a logic level of the signal output from the register 52 changes. Accordingly, according to the oscillator 1 of the embodiment, even when the power supply voltage Vdd variates in the normal operation mode of the circuit device 2, it is possible to reduce a risk of erroneous transition to the test mode.

According to the oscillator 1 of the embodiment, in the test mode of the circuit device 2, the T3 terminal and the first input and output circuit 30 are electrically cut off from each other, and the T4 terminal and the second input and output circuit 40 are electrically cut off from each other. Therefore, the signal of the T3 terminal and the signal of the T4 terminal are not influenced by the first input and output circuit 30 and the second input and output circuit 40, respectively. In the test mode of the circuit device 2, the oscillation circuit 10 stops the oscillation operation, so that the resonator 3 is not influenced by the oscillation circuit 10. Accordingly, the test device 100 can test the resonator 3 with high accuracy.

According to the oscillator 1 of the embodiment, in the circuit device 2, the T3 terminal and the T4 terminal necessary for the operation in the normal operation mode are also used for the test of the resonator 3 in the test mode and are also used for the setting of the register 52 in the external communication mode. Therefore, a dedicated terminal for the test mode and the external communication mode is unnecessary, which is advantageous for miniaturization. Accordingly, according to the oscillator 1 of the embodiment, for example, even in a case of using a small package in which it is difficult to provide a dedicated terminal for test, it is possible to test the resonator 3.

According to the oscillator 1 of the embodiment, the circuit device 2 is initialized to the normal operation mode at the time of power-on. Therefore, by turning on the power again when the operation mode is set to the test mode or the external communication mode, it is possible to reliably return to the normal operation mode from the operation mode.

4. Modification

The present disclosure is not limited to the embodiment, and various modifications can be made within the scope of the gist of the present disclosure.

For example, in the embodiment described above, the first switch 60 is provided on the signal path between the T1 terminal and the T3 terminal, and the second switch 70 is provided on the signal path between the T2 terminal and the T4 terminal. The first switch 60 may be provided on the signal path between the T1 terminal and the T4 terminal, and the second switch 70 may be provided on the signal path between the T2 terminal and the T3 terminal.

The oscillator 1 according to the above embodiment is a simple oscillator such as an SPXO, and may be an oscillator having a temperature compensation function such as a TCXO, or may be an oscillator having a frequency control function such as a VCXO. SPXO is an abbreviation for a simple packaged crystal oscillator. TCXO is an abbreviation for a temperature compensated crystal oscillator. VCXO is an abbreviation for a voltage controlled crystal oscillator. The oscillator 1 may be an oscillator having the temperature compensation function and the frequency control function such as a VC-TCXO, or may be an oscillator having a temperature control function such as an OCXO. VC-TCXO is an abbreviation for a voltage controlled temperature compensated crystal oscillator. OCXO is an abbreviation for an oven controlled crystal oscillator.

In the embodiment described above, a signal for controlling the output of the output buffer 20 is input to the T3 terminal electrically coupled to the first switch 60, but other control signals may be input. For example, a control signal for setting the oscillator 1 to a standby mode may be input to the terminal T3, or a signal for controlling the frequency of the clock signal CK may be input to the terminal T3 when the oscillator 1 is an oscillator having the frequency control function such as a VCXO.

The above embodiment and modification are examples, and the present disclosure is not limited thereto. For example, the embodiment and the modification may be combined as appropriate.

The present disclosure has substantially the same configurations as the configurations described in the embodiment, such as a configuration having the same function, method, and result and a configuration having the same object and effect. The present disclosure has a configuration in which a non-essential portion of the configuration described in the embodiment is replaced. The present disclosure may have a configuration capable of achieving the same function and effect or a configuration capable of achieving the same object as the configuration described in the embodiment. The present disclosure has a configuration obtained by adding a known technique to the configuration described in the embodiment.

The following contents are derived from the above embodiment and modification.

A circuit device according to an aspect includes:
a first terminal and a second terminal coupled to a resonator;
a third terminal;
a fourth terminal;
a first switch provided on a signal path between the first terminal and the third terminal;
a second switch provided on a signal path between the second terminal and the fourth terminal; and
a register configured to output a signal for controlling the first switch and the second switch to be turned on or off, in which
in a first mode, the first switch and the second switch are turned off, a control signal is input to the third terminal, and a clock signal is output from the fourth terminal, and
in a second mode, the first switch and the second switch are turned on.

In the circuit device, in the first mode, the first switch and the second switch are turned off, the third terminal and the fourth terminal are electrically cut off from the first terminal and the second terminal, and the clock signal based on the oscillation operation of the resonator is output from the fourth terminal according to the control signal input to the third terminal. On the other hand, in the second mode, the first switch and the second switch are turned on, and the third terminal and the fourth terminal are electrically coupled to the resonator via the first terminal and the second terminal. Accordingly, according to the circuit device, in the second mode, the test device can test the resonator using the third terminal and the fourth terminal. According to the circuit device, the third terminal and the fourth terminal necessary for the operation in the first mode are also used for the test of the resonator in the second mode. Therefore, a dedicated terminal for the second mode is unnecessary, which is advantageous for miniaturization.

In the circuit device, the first switch and the second switch are controlled to be turned on or off according to the signal output from the register. Therefore, the first switch and the second switch are not turned on in the first mode as long as the power supply voltage does not greatly variate as the logic level of the signal output from the register changes. Accordingly, according to the circuit device, even when the power supply voltage variates in the first mode, it is possible to reduce a risk of erroneous transition to the second mode for test.

The circuit device according to the aspect may include:
an amplifier circuit configured to amplify a signal from the first terminal and output the amplified signal to the second terminal.

The circuit device according to the aspect may include:
an oscillation circuit configured to oscillate the resonator;
an output buffer configured to receive an oscillation signal from the oscillation circuit and output the clock signal; and
an input and output circuit provided on a signal path between the output buffer and the fourth terminal, controlled by the register, turned on in the first mode, and turned off in the second mode.

According to the circuit device, since the fourth terminal and the input and output circuit are electrically cut off from each other in the second mode, a signal of the fourth terminal is not influenced by the input and output circuit.

The circuit device according to the aspect may include:
a first input and output circuit provided on a signal path between the third terminal and the register; and
a second input and output circuit provided on a signal path between the fourth terminal and the register, in which
in a third mode, a setting value for controlling the first switch and the second switch may be set to the register by communication using the third terminal and the fourth terminal.

According to the circuit device, the third terminal and the fourth terminal necessary for the operation in the first mode are also used for setting the register in the third mode. Therefore, a dedicated terminal for the third mode is unnecessary, which is advantageous for miniaturization.

In the circuit device according to the aspect,
in the third mode, the third terminal may serve as a serial data terminal and the fourth terminal may serve as a serial clock terminal.

In the circuit device according to the aspect,
the first mode may be set based on an initial value of the register set at the time of power-on.

According to the circuit device, since an operation mode is initialized to the first mode in which the resonator oscillates at the time of power-on, it is possible to reliably return to the first mode by turning on the power again when the operation mode is set to a mode other than the first mode.

An oscillator according to an aspect includes:
a resonator;
a circuit device coupled to the resonator; and
a container accommodating the resonator and the circuit device, in which
the circuit device includes:
a first terminal and a second terminal coupled to the resonator;
a third terminal;
a fourth terminal;
a first switch provided on a signal path between the first terminal and the third terminal;
a second switch provided on a signal path between the second terminal and the fourth terminal; and
a register configured to output a signal for controlling the first switch and the second switch to be turned on or off,
the container includes:
a first external terminal coupled to the third terminal; and
a second external terminal coupled to the fourth terminal,
in a first mode, the first switch and the second switch are turned off, a control signal is input to the first external terminal, and a clock signal is output from the second external terminal, and
in a second mode, the first switch and the second switch are turned on.

In the oscillator, in the first mode of the circuit device, the first switch and the second switch are turned off, the third terminal and the fourth terminal are electrically cut off from the first terminal and the second terminal, and the clock signal based on the oscillation operation of the resonator is output from the fourth terminal according to the control signal input to the third terminal. On the other hand, in the second mode of the circuit device, the first switch and the second switch are turned on, and the third terminal and the fourth terminal are electrically coupled to the resonator via the first terminal and the second terminal. Accordingly, according to the oscillator, in the second mode of the circuit device, the test device can test the resonator using the third terminal and the fourth terminal. According to the oscillator, in the circuit device, the third terminal and the fourth terminal necessary for the operation in the first mode are also used for the test of the resonator in the second mode. Therefore, a dedicated terminal for the second mode is unnecessary, which is advantageous for miniaturization.

In the oscillator, in the circuit device, the first switch and the second switch are controlled to be turned on or off according to a signal output from the register. Therefore, in the circuit device, the first switch and the second switch are not turned on in the first mode as long as the power supply voltage does not greatly variate as a logic level of the signal output from the register changes. Accordingly, according to the oscillator, in the first mode of the circuit device, even when the power supply voltage variates, it is possible to reduce a risk of erroneous transition to the second mode for test.

What is claimed is:
1. A circuit device comprising:
a first terminal and a second terminal coupled to a resonator;
a third terminal;
a fourth terminal to which a clock signal from an oscillation circuit is input;
a first switch provided on a signal path between the first terminal and the third terminal;
a second switch provided on a signal path between the second terminal and the fourth terminal; and
a register configured to output a signal for controlling the first switch and the second switch to be turned on or off, wherein in a first mode, the first switch and the second switch are turned off, a control signal is input to the third terminal, and the clock signal is output from the fourth terminal, and in a second mode, the first switch and the second switch are turned on.

2. The circuit device according to claim 1, further comprising:

an amplifier circuit configured to amplify a signal from the first terminal and output the amplified signal to the second terminal.

3. The circuit device according to claim 1, further comprising:

the oscillation circuit configured to oscillate the resonator;

an output buffer configured to receive an oscillation signal from the oscillation circuit and output the clock signal; and an input and output circuit provided on a signal path between the output buffer and the fourth terminal, controlled by the register, turned on in the first mode, and turned off in the second mode.

4. The circuit device according to claim 1, further comprising:

a first input and output circuit provided on a signal path between the third terminal and the register; and a second input and output circuit provided on a signal path between the fourth terminal and the register, wherein in a third mode, a setting value for controlling the first switch and the second switch is set to the register by communication using the third terminal and the fourth terminal.

5. The circuit device according to claim 4, wherein in the third mode, the third terminal serves as a serial data terminal and the fourth terminal serves as a serial clock terminal.

6. The circuit device according to claim 4, wherein the first mode is set based on an initial value of the register set at the time of power-on.

7. An oscillator comprising:

a resonator;

a circuit device coupled to the resonator; and a container accommodating the resonator and the circuit device, wherein the circuit device includes:

a first terminal and a second terminal coupled to the resonator;

a third terminal;

a fourth terminal to which a clock signal from an oscillation circuit is input;

a first switch provided on a signal path between the first terminal and the third terminal;

a second switch provided on a signal path between the second terminal and the fourth terminal; and a register configured to output a signal for controlling the first switch and the second switch to be turned on or off, the container includes:

a first external terminal coupled to the third terminal; and a second external terminal coupled to the fourth terminal, in a first mode, the first switch and the second switch are turned off, a control signal is input to the first external terminal, and the clock signal is output from the second external terminal, and in a second mode, the first switch and the second switch are turned on.

\* \* \* \* \*